(12) United States Patent
Buller et al.

(10) Patent No.: US 9,236,523 B2
(45) Date of Patent: Jan. 12, 2016

(54) METHOD AND APPARATUS FOR FORMING A TRANSPARENT CONDUCTIVE OXIDE USING HYDROGEN

(71) Applicant: FIRST SOLAR, INC, Perrysburg, OH (US)

(72) Inventors: Benyamin Buller, Sylvania, OH (US); Markus Gloeckler, Perrysburg, OH (US); David Hwang, Perrysburg, OH (US); Rui Shao, Sylvania, OH (US); Zhibo Zhao, Novi, MI (US)

(73) Assignee: FIRST SOLAR, INC, Perrysburg, OH (US)

( * ) Notice: Subject to any disclaimer, the term of this patent is extended or adjusted under 35 U.S.C. 154(b) by 0 days.

(21) Appl. No.: 13/785,495

(22) Filed: Mar. 5, 2013

(65) Prior Publication Data

US 2013/0230945 A1   Sep. 5, 2013

Related U.S. Application Data

(60) Provisional application No. 61/606,512, filed on Mar. 5, 2012.

(51) Int. Cl.
| | |
|---|---|
| *H01L 21/00* | (2006.01) |
| *H01L 31/18* | (2006.01) |
| *C23C 14/08* | (2006.01) |
| *C23C 14/58* | (2006.01) |
| *H01L 31/073* | (2012.01) |
| *H01L 31/0224* | (2006.01) |
| *H01L 31/0392* | (2006.01) |

(52) U.S. Cl.
CPC .......... *H01L 31/1864* (2013.01); *C23C 14/086* (2013.01); *C23C 14/5806* (2013.01); *H01L 31/022466* (2013.01); *H01L 31/03923* (2013.01); *H01L 31/03925* (2013.01); *H01L 31/073* (2013.01); *Y02E 10/541* (2013.01); *Y02E 10/543* (2013.01)

(58) Field of Classification Search
CPC .............. H01L 31/1884; H01L 31/073; H01L 31/022466; H01L 31/1872
USPC ...................................................... 438/95, 96
See application file for complete search history.

(56) References Cited

U.S. PATENT DOCUMENTS

| | | | |
|---|---|---|---|
| 3,811,953 A | * | 5/1974 | Nozik .......................... 136/256 |
| 5,291,036 A | | 3/1994 | Tran et al. |

(Continued)

FOREIGN PATENT DOCUMENTS

KR    1020060115295    * 11/2006 ............ H01L 31/04

OTHER PUBLICATIONS

V. Krishna Kumar et al., "Novel Procedure to Prepare Cadmium Stannate Films using Spray Pyrolysis Technique for Solar Cell Applications", 16, May 2005, pp. 1-15.

(Continued)

*Primary Examiner* — Reema Patel
(74) *Attorney, Agent, or Firm* — Dickstein Shapiro LLP

(57) ABSTRACT

A method and apparatus for forming a crystalline cadmium stannate layer of a photovoltaic device by heating an amorphous layer in the presence of hydrogen gas.

16 Claims, 7 Drawing Sheets

(56) References Cited

U.S. PATENT DOCUMENTS

| | | | |
|---|---|---|---|
| 5,922,142 | A | 7/1999 | Wu et al. |
| 6,137,048 | A * | 10/2000 | Wu et al. ............... 136/260 |
| 6,221,495 | B1 | 4/2001 | Wu et al. |
| 7,211,462 | B2 | 5/2007 | Romeo et al. |
| 8,053,350 | B2 | 11/2011 | Feldman-Peabody et al. |
| 2002/0064944 | A1 * | 5/2002 | Chung et al. ............... 438/637 |
| 2006/0017368 | A1 | 1/2006 | Bae et al. |
| 2009/0104733 | A1 | 4/2009 | Chae et al. |
| 2010/0206372 | A1 | 8/2010 | Buller et al. |
| 2010/0319775 | A1 * | 12/2010 | Mills et al. ............... 136/260 |
| 2011/0227131 | A1 * | 9/2011 | Zhao et al. ............... 257/184 |
| 2011/0240117 | A1 | 10/2011 | Yang et al. |
| 2012/0000520 | A1 | 1/2012 | Frey et al. |
| 2012/0003772 | A1 * | 1/2012 | Feldman-Peabody et al. . 438/61 |
| 2012/0042927 | A1 | 2/2012 | Lee |
| 2012/0164785 | A1 | 6/2012 | Blaydes et al. |

OTHER PUBLICATIONS

Mamazza et al., *Transparent conducting oxide thin films of $Cd_2SnO_4$ prepared by RF magnetron co-sputtering of the constituent binary oxides*, Thin Solid Films 484 (2005) 26-33, www.sciencedirect.com; available on-line at: linkinghub.elsevier.com/retrieve/pii/S0040609005001719.

Baratto, et al., *Sputtering deposition of amorphous cadmium stannate as transparent conducting oxide*, Thin Solid Films 520 (2012) 2739-2744, journal homepage: www.elsevier.com/locate/tsf; available on-line at: http://www.sciencedirect.com/science/article/pii/S0040609011020931.

Martin et al., *Properties of multilayer transparent conducting oxide films*, Thin Sold Films 461 (2004) 309-315, www.sciencedirect.com; available on-line at: linkinghub.elsevier.com/retrieve/pii/S0040609004001798.

* cited by examiner

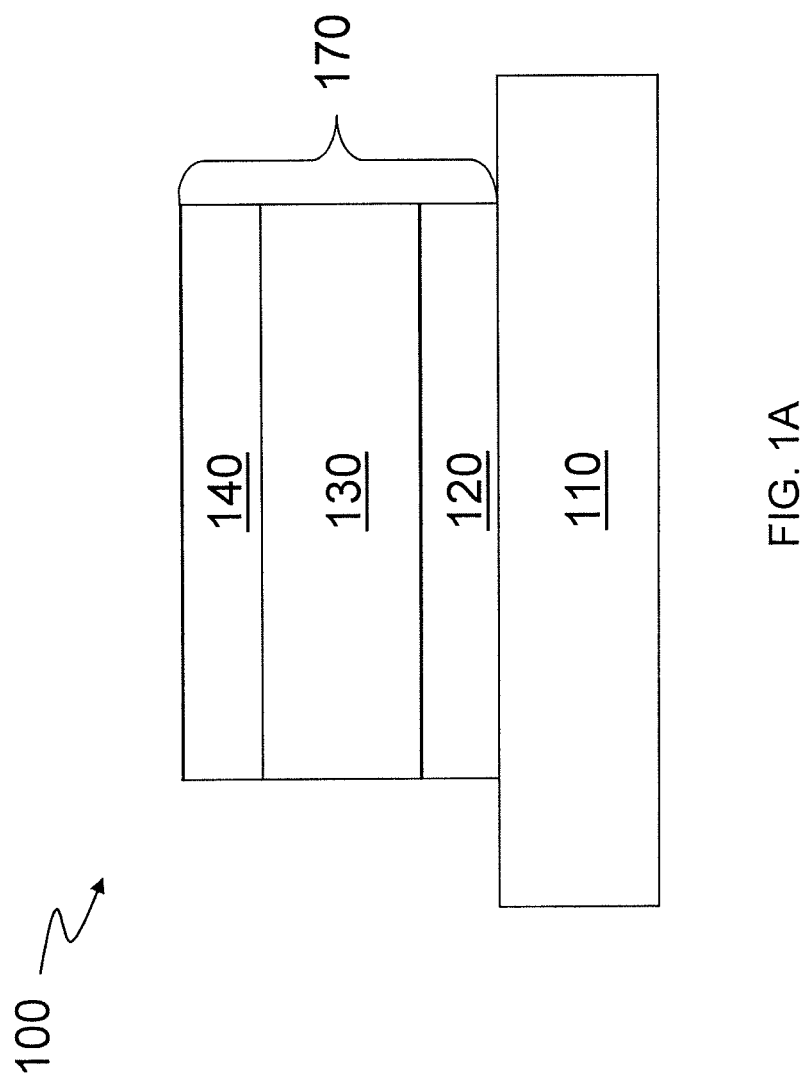

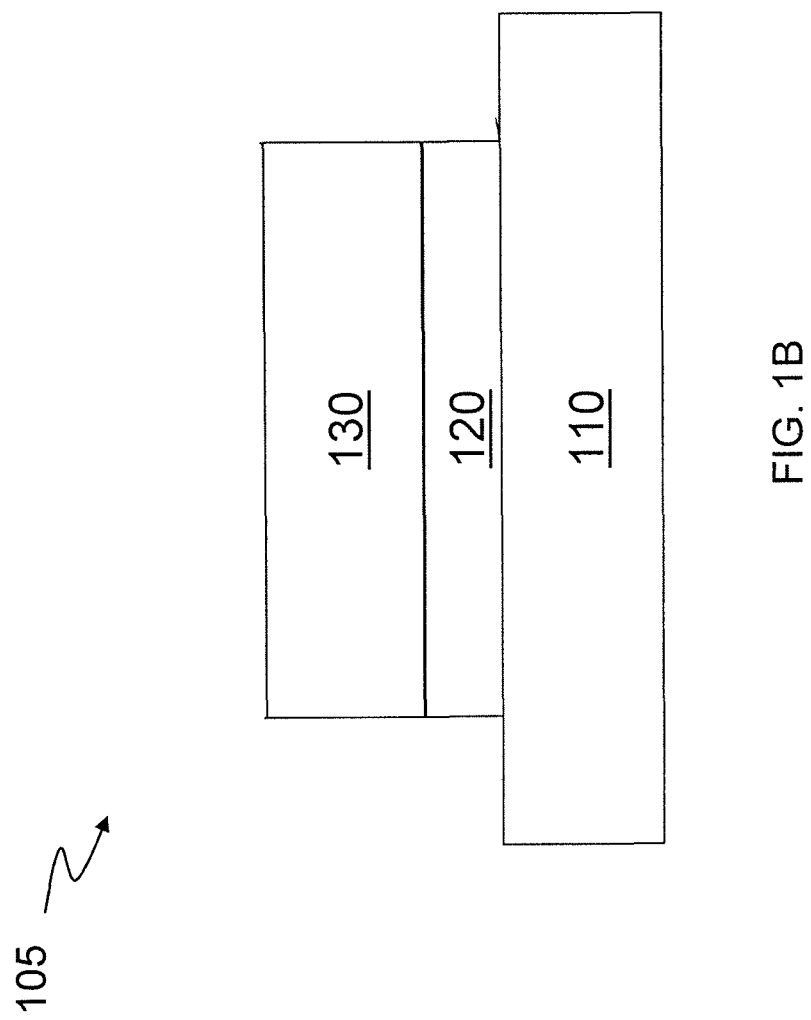

METHOD AND APPARATUS FOR FORMING A TRANSPARENT CONDUCTIVE OXIDE USING HYDROGEN

CLAIM OF PRIORITY

This application claims priority under 35 U.S.C. §119(e) to U.S. Provisional Patent Application Ser. No. 61/606,512 filed on Mar. 5, 2012, which is hereby incorporated by reference in its entirety.

TECHNICAL FIELD

Disclosed embodiments relate to the field of photovoltaic devices, which include photovoltaic cells and photovoltaic modules containing a plurality of cells, and more particularly, to a method and apparatus for forming a transparent conductive oxide using hydrogen gas.

BACKGROUND

Photovoltaic devices can include semiconductor material deposited over a substrate such as glass, for example, with a first layer of the semiconductor material serving as a window layer and a second layer of the semiconductor material serving as an absorber layer. The semiconductor window layer forms a junction with the semiconductor absorber layer where incident light is converted to electricity.

Photovoltaic devices can also include a transparent conductive oxide ("TCO") layer to conduct electrical charge. One TCO material which is often used is crystalline cadmium stannate. This is because of crystalline cadmium stannate's low sheet resistance and high light transmissivity.

One conventional method of forming crystalline TCO layer is to deposit an amorphous layer of cadmium and tin oxide onto a substrate and to then transform the deposited amorphous layer to a crystalline form. This is done by annealing the amorphous layer at a high temperature (e.g., typically a temperature greater than 550° C.), in a low oxygen partial pressure environment (i.e., an oxygen-deficient or reduced atmosphere) for a sufficient amount of annealing time (e.g., at least 10 minutes).

To provide the low oxygen partial pressure environment, current photovoltaic device manufacturing processes advocate forming the semiconductor window layer, which may be made of cadmium sulfide, on the amorphous TCO layer before it is annealed. Doing so deprives the amorphous layer of oxygen that may be available in an ambient processing atmosphere. In addition, the cadmium sulfide layer over the amorphous TCO layer encourages any oxygen that may be present in the amorphous TCO layer to diffuse out of it. Specifically, oxygen that diffuses out of the amorphous TCO layer may react with the cadmium sulfide to form cadmium oxide which may evaporate at temperatures of about 600° C. and above and sulfur dioxide which will diffuse into the deposition ambient. This reaction then produces oxygen vacancies in the amorphous layer. Each oxygen vacancy acts as an electron donor which, once the amorphous TCO layer is transformed to a crystalline form, helps with electrical conductivity. Thus, the window layer is used as a reducing agent because it creates the needed oxygen-deficient atmosphere that promotes the oxygen vacancies in the TCO layer.

However, forming the cadmium sulfide window layer on the TCO layer before the amorphous TCO layer is annealed requires a longer annealing time, or a higher annealing temperature or both than would have been needed otherwise to transform the amorphous layer to the crystalline form. Using high temperatures for long periods of time can damage glass substrates. For example, glass substrates will often begin to soften at a temperature of about 550° C. and above. Thus, subjecting the glass substrates to such a high annealing temperature (i.e., greater than 550° C.) for such a relatively long time (i.e., 10 minutes or more), increases the risk of damaging the substrates. Specifically, the glass substrates may begin to soften and warp at the high annealing temperatures applied for such long annealing periods of time. Further, the high annealing temperature has a tendency to ionize sodium atoms or molecules present in the glass substrates, which over time may diffuse to other layers of the devices. Diffusion of sodium ions in certain layers of the devices may adversely affect device performance. In addition, a long annealing time decreases productivity and also subjects the annealing chamber to conditions favorable to chamber degradation, which can require remediation. Finally, the high annealing temperature used to transform the amorphous layer into crystalline is one of many high temperatures to which the devices may be subjected while being processed. For example, other layers have to be annealed at high temperatures. Thus, the devices may be subjected to a plurality of high thermal cycles. These thermal cycles may weaken the glass and subject it to a high degree of breakage.

Accordingly, a method of transforming an amorphous TCO layer to a crystalline form which mitigates against these potential problems is desired.

DESCRIPTION OF DRAWINGS

FIG. 1A is a schematic of a partially constructed photovoltaic device.

FIG. 1B is a schematic of a partially constructed photovoltaic device.

DETAILED DESCRIPTION

In the following detailed description, reference is made to the accompanying drawings which form a part hereof, and in which is shown by way of illustration specific embodiments that may be practiced. These embodiments are described in sufficient detail to enable those skilled in the art to make and use them, and it is to be understood that structural, logical, or procedural changes may be made to the specific embodiments disclosed without departing from the spirit and scope of the invention.

Embodiments described herein provide for a method of forming a TCO layer by heat-treating or annealing an amorphous TCO layer of cadmium and tin oxide, for example, in the presence of hydrogen to transform the amorphous TCO layer to at least a partially, if not completely, crystalline form. According to a disclosed embodiment, the amorphous TCO layer may be annealed before formation of the window layer. This allows for much lower annealing temperatures. Amorphous TCO layer annealing in the presence of hydrogen may occur in the same environment as, for example, a multiple-zone oven, but prior to, a semiconductor deposition process, for example, vapor transport deposition, close space sublimation, evaporation, sputtering or other semiconductor deposition process.

Further, just as in the case of using cadmium sulfide as the reducing agent, the hydrogen gas is also used as a reducing agent. For example, the hydrogen gas, similarly to the cadmium sulfide, shields the amorphous TCO layer from any oxygen present in the deposition environment and thus creates an oxygen-deficient environment. In addition, the hydrogen gas diffuses into the amorphous TCO layer where it reacts with oxygen within the amorphous TCO layer to form water on or within the amorphous TCO layer which evaporates during the annealing process. Again, just as in the case of using cadmium sulfide as the reducing agent, oxygen molecules that have reacted with the hydrogen gas will produce vacancies in the amorphous TCO layer. These oxygen molecules will act as electron donors which, once the amorphous TCO layer is transformed to a crystalline form, will help with electrical conductivity.

Referring now to FIG. 1A, a partially constructed photovoltaic device 100 is depicted. The partially constructed photovoltaic device 100 includes a TCO stack 170 adjacent to a substrate layer 110. The substrate layer 110 can be the outermost layer of the device 100 and, in use, may be exposed to a variety of temperatures and forms of precipitation, such as rain, snow, sleet, and hail. Thus, among other uses, the substrate layer 110 serves as a protective layer. The substrate layer 110 may also be the first layer that incident light encounters upon reaching the device 100. It is therefore desirable to select a material for the substrate layer 110 that is both durable and highly transparent. For these reasons, the substrate layer 110 may include, for example, borosilicate glass, soda-lime glass, or float glass.

Figure 4:
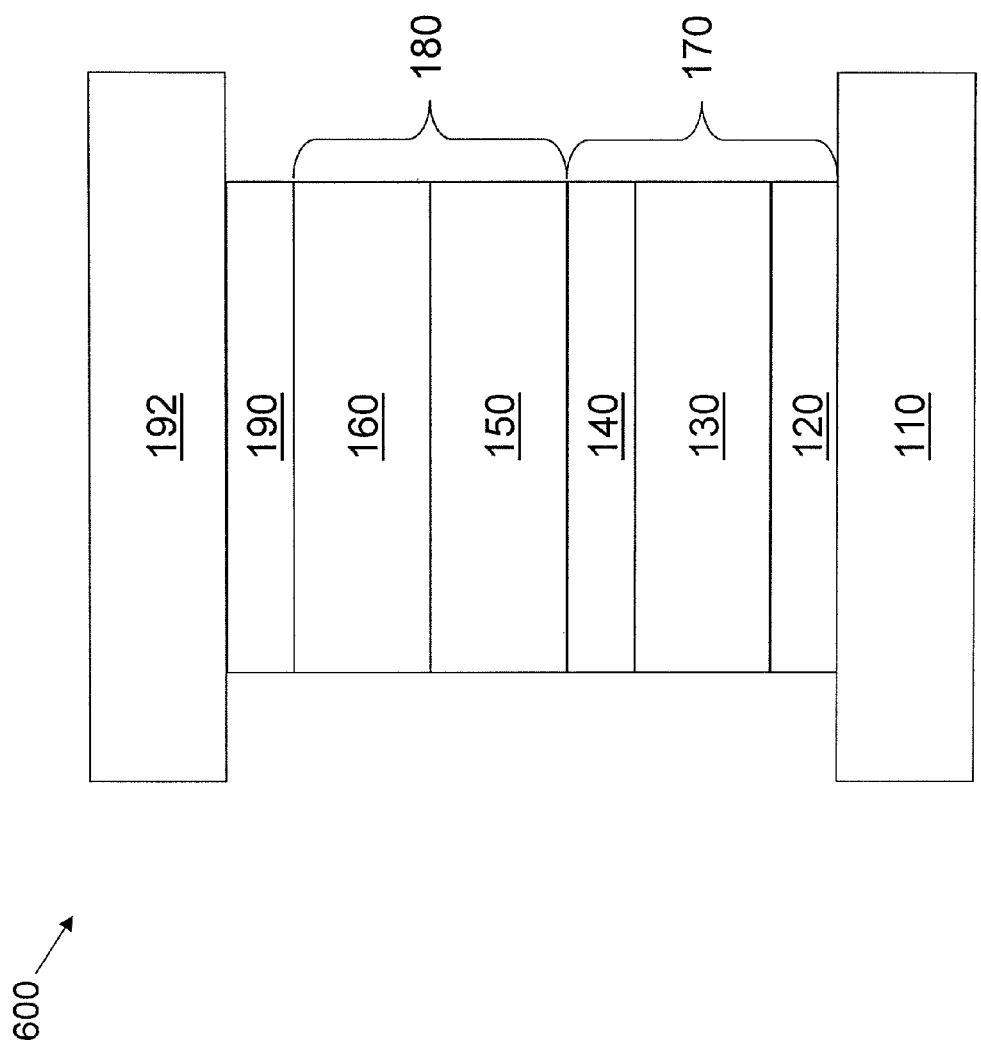
FIG. 4 is a schematic of a photovoltaic device according to an embodiment.

The TCO stack 170 may be formed adjacent to the substrate layer 110 and may include a plurality of layers. For example, the TCO stack 170 may include a barrier layer 120 adjacent to the substrate layer 110, an amorphous TCO layer 130 adjacent to the barrier layer 120, and a buffer layer 140 adjacent to the amorphous TCO layer 130, though the buffer layer 140 may be omitted. The barrier layer 120 is used to lessen diffusion of sodium or other contaminants from the substrate layer 110 to other layers of the device 100. These other layers may include layers of semiconductor material 180 (see FIG. 4). The barrier layer may be formed of various materials including silicon nitride, silicon dioxide, aluminum-doped silicon oxide, boron-doped silicon nitride, phosphorus-doped silicon nitride, silicon oxide-nitride, or any combination or alloy thereof. The buffer layer 140 is used to decrease irregularities that may occur during the formation of the layers of semiconductor material 180 (FIG. 4). The buffer layer 140 may be of various suitable materials, including tin oxide (e.g., a tin (IV) oxide), zinc tin oxide, zinc oxide, zinc oxysulfide, and zinc magnesium oxide. As noted above, the amorphous TCO layer 130 may be formed of cadmium and tin. The TCO stack 170 may be formed through a series of manufacturing steps where each successive layer is formed adjacent to a previous layer on the device 100.

Layers 120, 130 and 140 of the TCO stack 170 can be formed using any suitable technique, such as sputtering, for example, as described in U.S. patent application Ser. No. 12/860,115, entitled "Doped Transparent Conductive Oxide," filed on Aug. 20, 2010, which is hereby incorporated by reference in its entirety. The layers of the TCO stack 170 may also be formed using other deposition techniques, such as, for example, low pressure chemical vapor deposition, atmospheric pressure chemical vapor deposition, plasma-enhanced chemical vapor deposition, thermal chemical vapor deposition, spin-on deposition, and spray-pyrolysis.

The amorphous TCO layer 130 can be of any suitable thickness. For example, amorphous TCO layer 130 can have a thickness of about 10 nm to about 1000 nm. The amorphous TCO layer 130 can include any ratio of cadmium to tin suitable for the resulting cadmium stannate. For example, the cadmium-to-tin atomic ratio can be about 2:1. The amorphous TCO layer 130 can also have any surface roughness ($R_a$) as well as any suitable average optical absorption. The amorphous TCO layer 130 may have an average optical absorption of less than about 20% in the wavelength range of about 400-850 nm, and a surface roughness of less than about 1 nm.

Following formation of the TCO stack 170 (FIG. 1A) or, alternatively, following formation of the amorphous TCO layer 130 (FIG. 1B) if buffer layer 140 is omitted or not yet formed, and prior to formation of the window layer 150 (FIG. 4), the amorphous TCO layer is transformed to crystalline cadmium stannate by being heat-treated in the presence of hydrogen. The heat-treatment may occur in the same environment as, for example, a multiple-zone oven, but prior to, a semiconductor deposition process, for example, vapor transport deposition, close space sublimation, evaporation, sputtering or other semiconductor deposition process. The heat-treatment may be performed at temperatures between 500° C. and 650° C. This is at least 25° C. less than what has been needed conventionally when using the cadmium sulfide window layer as a reducing agent. It should be noted that soda-lime glass can begin to soften at temperatures above about 550° C.

Figure 2A:
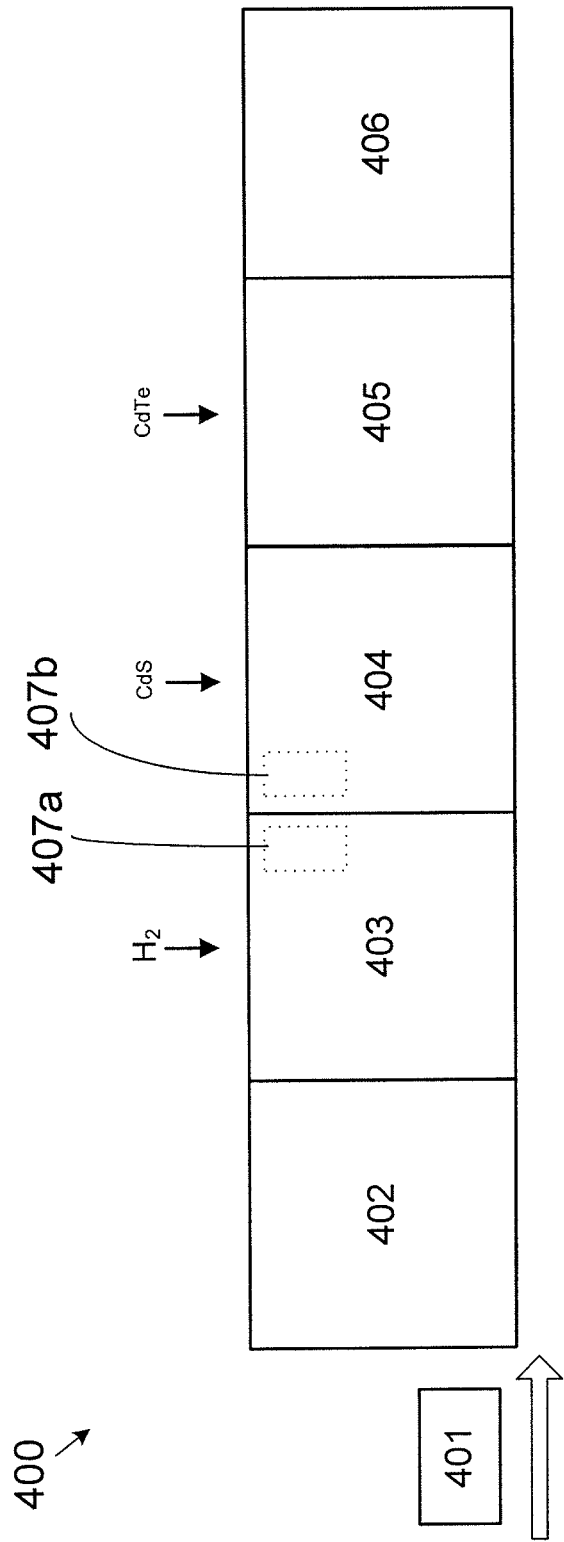
FIG. 2A is a schematic of a multiple-zone oven according to an embodiment.
Figure 2B:
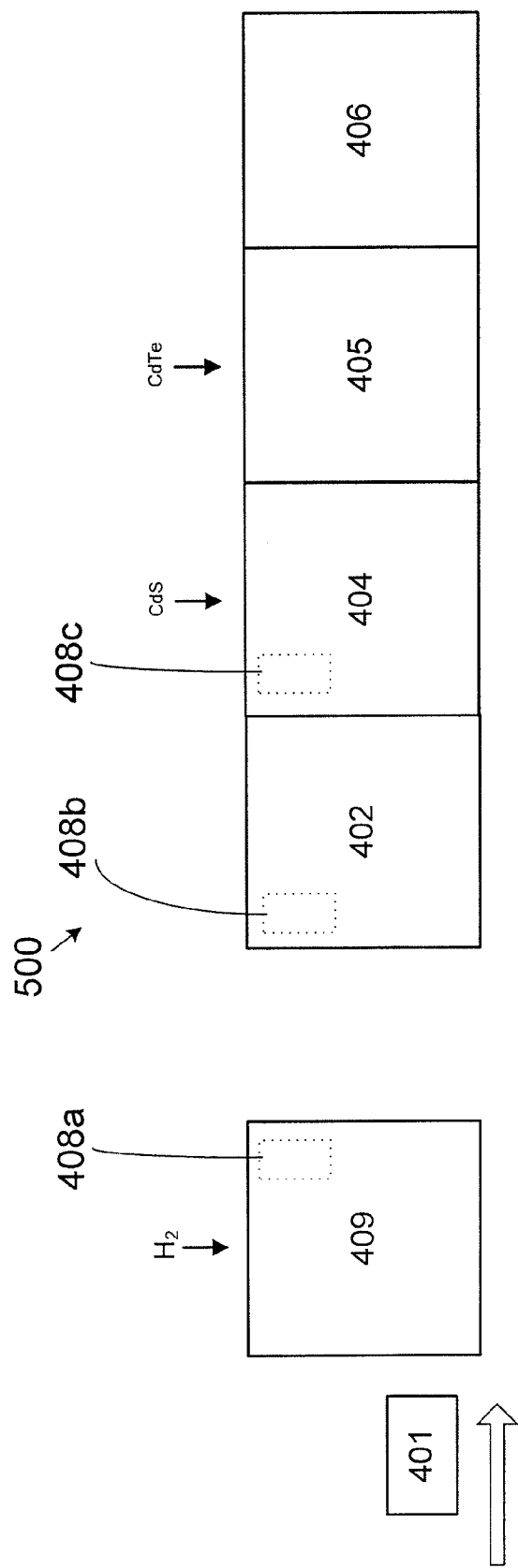
FIG. 2B is a schematic of a multiple-zone oven according to an embodiment.
Figure 3:
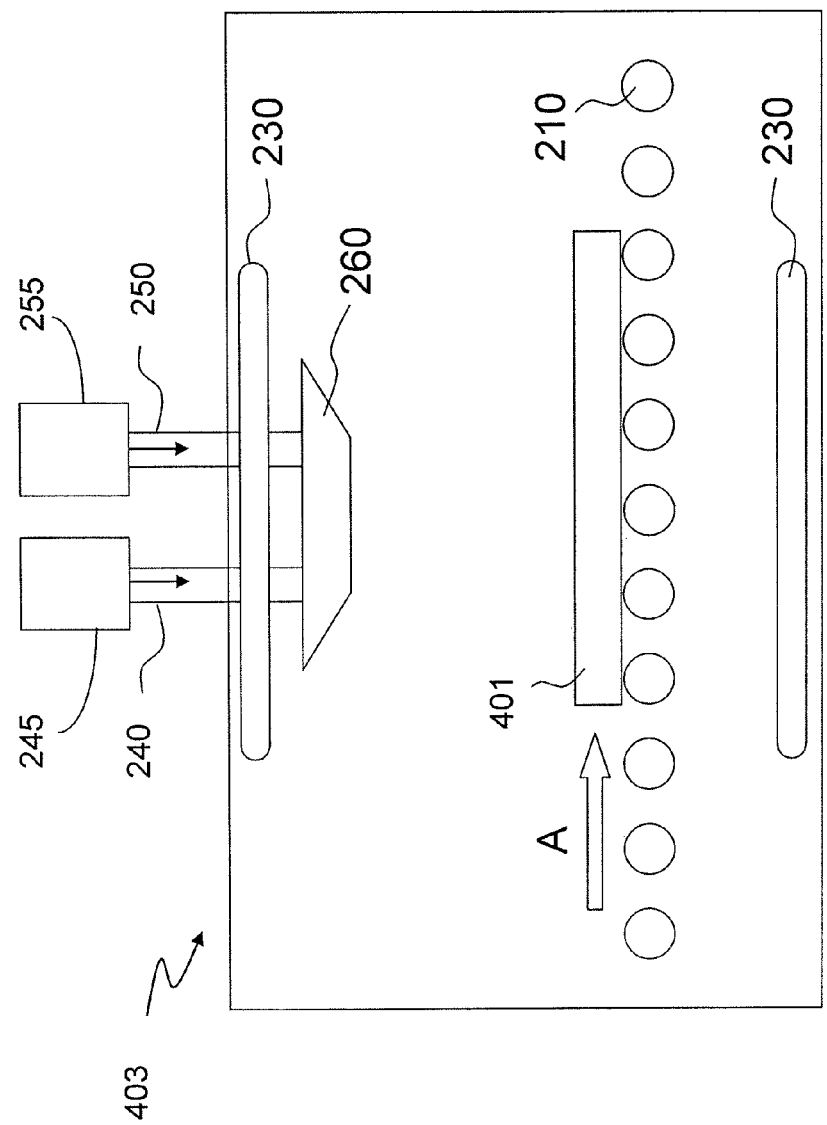
FIG. 3 is a transformation zone according to an embodiment.

Referring to FIGS. 2A, 2B and 3, by way of example, a substrate 401 coated with an amorphous TCO layer 130 is transported through a transformation zone 403 of a multiple-zone oven 400 on a transport mechanism. Multiple-zone oven 400 may be used for any semiconductor deposition technique, for example, vapor transport deposition, close space sublimation, evaporation, sputtering or other semiconductor deposition process. Coated substrate 401 can be partially constructed photovoltaic device 100 (FIG. 1A) having a buffer layer 140 or partially constructed photovoltaic device 105 (FIG. 1B) without a buffer layer, for example. In various embodiments, the transport mechanism may be rollers, a belt, or other conveying means. The multiple-zone oven 400 can be of any suitable size and/or capacity. The multiple-zone oven 400 can contain separate heat zones to control the temperature therein. The multiple-zone oven 400 may have an entry zone 402, a transformation zone 403 where hydrogen is introduced to transform the amorphous TCO layer 130 to a crystalline form, semiconductor deposition zones 404 and 405 for semiconductor formation, and exit zone 406. Alternatively, as shown in FIG. 2B, a transformation zone 409 could be a stand-alone oven separate from a multiple-zone oven 500, which is otherwise identical to multiple-zone oven 400. Transformation zone 409 is identical to zone 403 except that zone 409 is separate from multiple-zone oven 500.

The transformation zone illustrated generally as 403 in FIG. 2A and 409 in FIG. 2B is more specifically illustrated in FIG. 3. As shown in FIG. 3, a hydrogen gas, a hydrogen gas mixture, for example, hydrogen combined with an inert gas such as nitrogen, argon or helium, or a gas capable of releasing hydrogen such as silane ($SiH_4$), is supplied by a first gas source 245 via a first input line 240 for introduction into the transformation zone 403. If a hydrogen gas mixture is employed, the inert gas may be supplied by a second gas source 255 and introduced through a second input line 250. The hydrogen gas/mixture is metered into the transformation zone 403 and is diffused therein through a diffuser 260 in an amount and at an appropriate location over the moving coated substrate 401 to achieve a desired concentration of hydrogen gas within the transformation zone 403. The desired concentration of hydrogen gas may be anywhere between 0.01% to about 10%. However, in some particular embodiments a 1% concentration of hydrogen gas may be used. Further and as mentioned above, the temperature of the transformation zone 403 may be anywhere between about 500° C. and about 650° C., or below about 550° C.

The diffuser 260 may be omitted and the hydrogen gas/mixture may be introduced via one or both of input lines 240, 250 and diffuse within the transformation zone 403 under ambient conditions. The rate of travel of coated substrate 401 through transformation zone 403 allows the coated substrate 401 to be in the transformation zone 403 for a long enough time for the conversion of the amorphous material to crystalline to occur.

The transformation zone 403 may include one or more heaters 230 to bring the temperature up to as well as to maintain a desired processing temperature (i.e., a temperature between 500° C. to 650° C.). The heating can be conducted anywhere from 3 minutes to 25 minutes, depending on the temperature used. As an example, the coated substrate 401 can be heated for about 25 minutes at about 500° C., or for about 3 minutes at about 650° C. The heating provided by the one or more heaters 230 can provide radiated heating, convective heating, and/or resistive heating.

The multiple-zone oven 400, 500 may be a controlled ambient oven, in which load/exit locks, i.e., a chamber or zone that includes one or more doors, or gas separation curtains, i.e., fast-moving streams of inert gas, provided in entry and exit zones 402 and 406, for example, may be used to keep hydrogen gas/mixture inside the ovens 400, 500.

Referring again to FIG. 2A, if coated substrate 401 does not contain buffer layer 140 (FIG. 1B) and the heating process in the presence of hydrogen occurs in transformation zone 403, buffer layer 140 (FIG. 4) can be formed after the heating step by sputtering apparatus 407a or 407b in respective zone 403 or 404, illustrated in FIG. 2A by the dotted lines, prior to deposition of a window layer 150 in zone 404. One of sputtering apparatuses 407a and 407b can be provided for deposition of buffer layer 140.

Referring again to FIG. 2B, if transformation zone 409 is employed and coated substrate 401 does not contain buffer layer 140, buffer layer 140 (FIG. 4) can be formed after the heating step by sputtering apparatus 408a, 408b or 408c in respective zone 409, 402 or 404, illustrated in FIG. 2B by the dotted lines, prior to deposition of the window layer 150 in zone 404. One of sputtering apparatuses 408a, 408b and 408c can be provided for deposition of buffer layer 140.

Now referring again to FIGS. 2A, 2B and 4, after the amorphous TCO layer is annealed, a layer of semiconductor material 180 can be formed in zones 404 and 405 of multiple-zone oven 400 or 500 by, for example, vapor transport deposition, close space sublimation, evaporation, sputtering or other semiconductor deposition process. The layer of the semiconductor material 180 can include a bi-layer. The bi-layer may include a window layer 150 formed in zone 404, for example, of cadmium sulfide or cadmium zinc sulfide, and an absorber layer 160 formed in zone 405, for example, of cadmium telluride, copper indium diselenide, copper indium disulfide, copper indium aluminum diselenide, or copper indium gallium diselenide (CIGS), formed on the window layer 150. The window layer 150 and the absorber layer 160 may be positioned in contact with one another to create an electric field. Photons can free electron-hole pairs upon making contact with the absorber layer 160, the electric field leads to electron-hole separation sending electrons to the n side (absorber layer 160) and holes to the p side (window layer 150). The resulting electron flow provides current, which combined with the resulting voltage from the electric field, creates power. The result is the conversion of photon energy into electric power. Each layer in photovoltaic device 600 may, in turn, include more than one layer or film. Additionally, each layer can cover all or a portion of the photovoltaic device 600 and/or all or a portion of the layer or substrate underlying the layer. For example, a "layer" can include any amount of any material that contacts all or a portion of a surface.

Referring to FIG. 4, following formation of the layers of semiconductor material 180, a back contact metal 190 may be deposited onto the absorber layer 160. Back contact metal 190 may be one or more highly conductive materials, for example, molybdenum, aluminum, copper, silver, gold, or any combination thereof, providing a low-resistance ohmic contact. A back support 192 may be deposited onto the back contact metal 190. The back support 192 may include any suitable material, including a glass, for example, a soda-lime glass.

Figure 5:
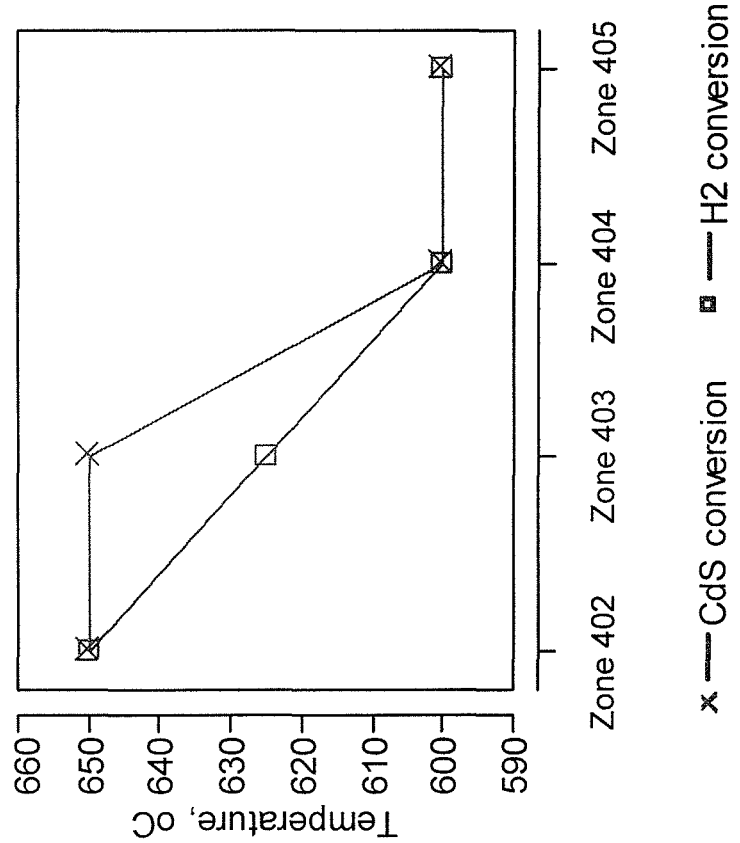
FIG. 5 is a graph showing an annealing temperature effect of hydrogen.

FIG. 5 is a graph depicting annealing temperatures (y-axis) versus locations where layers of the device are annealed (x-axis). On the graph, two lines are shown, one having data points indicated with an "x" and the other having data points indicated with a "☐". The line with the "x" datapoints represents conversion using cadmium sulfide as the reducing agent and the line with the "☐" datapoints represents conversion using hydrogen gas as the reducing agent. According to the graph, in zone 403 where the TCO layer is annealed, it takes a temperature of 625° C. to transform an amorphous TCO layer into a crystalline TCO layer when the hydrogen gas is used as the reducing agent as opposed to 650° C. when the cadmium sulfide is used as the reducing agent.

For that TCO conversion using hydrogen gas, 2,000 sccm (standard cubic centimeter) flow of 2.9% hydrogen gas diluted with helium and 4,000 sccm pure helium were sourced into transformation zone 403 to reach a 0.97% hydrogen gas concentration in the transformation zone 403. The use of hydrogen gas therefore permits a significant reduction in TCO annealing temperature. Note that the magnitude of the reduction can be changed by adjusting the hydrogen concentration in the transformation zone.

The embodiments described above are offered by way of illustration and example. It should be understood that the examples provided above may be altered in certain respects and still remain within the scope of the claims. It should be appreciated that, while the invention has been described with reference to the above example embodiments, other embodiments are within the scope of the claims. It should also be understood that the appended drawings are not necessarily to scale, presenting a somewhat simplified representation of various features and basic principles of the invention.

What is claimed as new and desired to be protected by Letters Patent of the United States is:

1. A method of forming a photovoltaic device comprising:
    depositing an amorphous layer containing cadmium and tin over a substrate;
    placing the substrate in a multiple-zone oven, which includes a transformation zone and a semiconductor deposition zone, wherein the transformation zone contains hydrogen gas at a concentration of about 0.01% to about 10%;
    heat-treating the substrate in the transformation zone to convert the amorphous layer deposited on the substrate into a completely crystalized cadmium stannate layer, wherein the substrate is heat-treated for between about 3 minutes and about 25 minutes; and after heat-treatment, depositing a buffer layer over the crystalized cadmium stannate layer in the transformation zone; and depositing a semiconductor material over the buffer layer in the semiconductor deposition zone.

2. The method of claim 1, wherein the semiconductor material is deposited by a deposition technique selected from the group consisting of vapor transport deposition, close space sublimation, evaporation and sputtering.

3. The method of claim 2, wherein the semiconductor material is deposited by vapor transport deposition.

4. The method of claim 1, wherein the hydrogen concentration is about 1%.

5. The method of claim 1, wherein the substrate is heat-treated at a temperature of less than about 550° C.

6. The method of claim 1, wherein the substrate is heat-treated for between about 15 minutes and about 20 minutes.

7. The method of claim 1, wherein the substrate is heat-treated in the presence of a gas mixture comprising hydrogen gas and an inert gas.

8. The method of claim 7, wherein the inert gas comprises one of the group of argon, nitrogen and helium.

9. The method of claim 8, wherein the inert gas comprises helium.

10. The method of claim 1, further comprising diffusing the hydrogen gas into the transformation zone using a diffuser.

11. The method of claim 1, wherein sputtering is used to deposit the buffer layer.

12. A method of forming a photovoltaic device comprising:

depositing an amorphous layer containing cadmium and tin over a substrate;

for a period of about 3 minutes to about 25 minutes, heat-treating the substrate in a multiple-zone oven, wherein the multiple-zone oven includes a transformation zone and a semiconductor deposition zone, at a temperature between about 500° C. and about 650° C. in the presence of hydrogen gas at a concentration of about 0.01% to about 10% to convert the amorphous layer deposited on the substrate into a completely crystalized cadmium stannate layer in the transformation zone;

depositing a buffer layer over the crystalized cadmium stannate layer in the transformation zone after heat-treatment; and depositing a semiconductor material over the buffer layer in the semiconductor deposition zone.

13. The method of claim 12, wherein the substrate is heat-treated in the presence of a gas mixture comprising hydrogen gas and an inert gas.

14. The method of claim 12, wherein the buffer layer is deposited before the substrate is heat-treated.

15. The method of claim 12, wherein the buffer layer comprises at least one material selected from the group consisting of tin oxide, zinc tin oxide, zinc oxide, zinc oxysulfide, and zinc magnesium oxide.

16. The method of claim 12, wherein sputtering is used to deposit the buffer layer.

* * * * *